United States Patent [19]

Schlesinger et al.

[11] 3,890,149

[45] June 17, 1975

[54] WATERLESS DIAZO PLANOGRAPHIC PRINTING PLATES WITH EPOXY-SILANE IN UNDERCOAT AND/OR OVERCOAT LAYERS

[75] Inventors: Sheldon Irwin Schlesinger, Hightstown; Ronald J. Boszak, Trenton, both of N.J.; Laurence Verlan Shuppert; Richard James Cowling, both of Neenah, Wis.

[73] Assignee: American Can Company, Greenwich, Conn.

[22] Filed: May 2, 1973

[21] Appl. No.: 356,282

[52] U.S. Cl. .......................... 96/33; 96/75; 96/86 P; 96/87 R; 96/91 R; 96/115 R; 96/115 P; 101/455; 101/456; 101/457; 101/458; 101/459; 101/467

[51] Int. Cl. .............................................. G03f 7/08

[58] Field of Search ........ 96/75, 33, 35.1, 36, 91 R, 96/115 R, 115 P, 86 P, 87 R, 85; 101/455, 456, 457, 458, 467

[56] References Cited

UNITED STATES PATENTS

| | | | |
|---|---|---|---|
| 3,060,026 | 10/1962 | Heiart | 96/115 P X |
| 3,136,637 | 6/1964 | Larsow | 96/75 |
| 3,205,157 | 9/1965 | Licari | 96/115 R |
| 3,209,683 | 10/1965 | Greubel | 96/33 |
| 3,241,486 | 3/1966 | Greubel et al. | 96/33 |
| 3,295,974 | 1/1967 | Erdmann | 96/91 R |
| 3,396,019 | 8/1968 | Uhlig | 96/75 |
| 3,462,267 | 8/1969 | Giangualano et al. | 96/33 |
| 3,511,178 | 5/1970 | Curtin | 96/75 |
| 3,526,504 | 9/1970 | Celeste | 96/35.1 |
| 3,615,538 | 10/1971 | Peters et al. | 96/33 |
| 3,632,375 | 1/1972 | Gipe | 96/75 X |
| 3,652,272 | 3/1972 | Thomas | 96/75 |
| 3,652,274 | 3/1972 | Verelst et al. | 96/35.1 |
| 3,660,097 | 5/1972 | Mainthia | 96/75 |
| 3,677,178 | 7/1972 | Gipe | 96/75 |
| 3,679,419 | 7/1972 | Gillich | 96/33 |
| 3,708,296 | 1/1973 | Schlesinger | 96/33 |
| 3,711,390 | 1/1973 | Feinberg | 96/91 R |
| 3,728,123 | 4/1973 | Gipe | 96/33 |
| 3,758,306 | 9/1973 | Roos | 96/35.1 |
| 3,779,774 | 12/1973 | Cope et al. | 96/91 R |
| 3,782,940 | 1/1974 | Ohto et al. | 96/35.1 |
| 3,790,385 | 2/1974 | Steppan et al. | 96/115 R |

*Primary Examiner*—Charles L. Bowers, Jr.
*Attorney, Agent, or Firm*—Robert P. Auber; Ernestine C. Bartlett; George P. Ziehmer

[57] ABSTRACT

A positive-acting presensitized plate for use in waterless or dry planography is provided, said plate being comprised of a substrate having coated thereon as an undercoat layer, a composition comprising an epoxy resin, a radiation-sensitive catalyst precursor and an epoxy-silane and, as an overcoat layer, a composition comprising an organosiloxane in admixture with from 0 to 50 percent of an epoxy silane. Planographic printing plates and a process for their manufacture are also provided.

40 Claims, 4 Drawing Figures

WATERLESS DIAZO PLANOGRAPHIC PRINTING PLATES WITH EPOXY-SILANE IN UNDERCOAT AND/OR OVERCOAT LAYERS

BACKGROUND OF THE INVENTION

Planographic printing plates have a coating of a light-sensitive composition that is adherent to a suitable base sheet material, for example, an aluminum sheet. If the light-sensitive coating is applied to the base sheet by the manufacturer, the plate is referred to as a "presensitized plate." Depending upon the nature of the photosensitive composition employed, a coated plate can be utilized to reproduce directly the image to which it is exposed, in which case the plate is termed positive-acting, or to reproduce an image which is the reverse of the image to which it is exposed, in which case the plate is termed negative-acting. In either event the image area of the developed plate is relatively oleophilic and the non-image area is relatively oleophobic.

A conventional negative lithographic plate is exposed to light through a negative transparency of the desired image. The light causes the exposed light-sensitive material to harden the coating on the plate, making the exposed area insoluble in a developing solution thereafter applied to the plate for the purpose of removing the portion of the light-sensitive coating which, because it was protected from the light by opaque areas of the negative transparency, was not exposed. The light-cured or exposed surface of a negative plate is the oleophilic surface compatible with the printing ink and is called the image area; the surface from which the non-exposed light-sensitive coating is removed by the developing solution is the hydrophilic surface having little affinity for the ink and is called the non-image area. Such a plate can be utilized to reproduce an image which corresponds to a reversal of the image to which it is exposed.

In usage, a conventional positive plate differs in that the hydrophilic non-image area is formed in the portion of the light-sensitive coating exposed through a positive image transparency whereas the unexposed portion is hydrophobic to form the ink-receptive image area. Such a plate can be utilized to reproduce directly an image which corresponds to the actual image to which it is exposed.

Lithography, by definition, is based on the mutual repellency of oil and water. Thus, negative and positive lithographic plates described above, after imaging, have been utilized with aqueous lithographic solutions. The hydrophobic areas of the plate are not wet by the solution while the hydrophilic areas are wet by the solution. Following the wetting of the hydrophilic areas, a roller covered with greasy (oily) lithographic printing ink is rolled across the surface of the plate leaving a film of ink on the hydrophobic (oleophilic) areas but not on the wet areas. This ink film is then transferred to another surface brought into contact therewith such as the paper sheet in direct lithography or the offset blanket in offset lithography.

In the history of commercial lithography, the fact that water must be used to prevent ink from sticking to certain areas of the surface has been one of the major technical problems to be overcome. For example, special inks, rollers and paper have had to be developed and in most cases, maintaining the careful balance between the amount of ink fed to the plate and the amount of water applied to the surface is difficult and leads to problems when not maintained, e.g., too much water leads to weak prints and insufficient water allows the non-image areas to pick up ink and print.

Recently, workers in the art, in attempts to overcome the problems of conventional lithography, have provided several versions of lithographic plates suitable for dry or waterless planography. Such plates, however, have been generally commercially unacceptable either in terms of complicated processing and development steps necessary to use the plate, insufficient adhesion between the multiple layers, (a particularly troublesome problem where abhesive silicones are employed), susceptibility to deleterious action of light and/or inadequate press-life. One such patent, for example, U.S. Pat. No. 3,511,178, discloses negative and positive-acting plates wherein a silicone resin rests physically above a light-sensitive layer and depends upon a bond derived either by decomposition or insolubilization of a component in the layer infra thereto for adhesion between the various layers. In the negative-acting plate, for example, the exposed areas are removed during development because of the solubilization of a photolyzed diazonium phosphotungstate layer whereby the unexposed areas remain on the substrate and become the non-printing oleophobic areas. In such a plate, the originally non-exposed areas are susceptible to subsequent photolysis by room light and are subject to degradation by water, aqueous mixtures or even by high relative humidity of the atmosphere. Even with the positive-acting plate which comprises an abhesive, silicone layer coated over an initially water-soluble light-sensitive diazodiphenylamine-formaldehyde resin, adhesion between layers depends solely on the photolytic insolubilization of the diazo sensitizer which may lead to adhesive failure between layers.

Another patent U.S. Pat. No. 3,632,375, seeks, in a negative-working plate, to solve the problem of obtaining ready adhesion of diazo sensitizers to silicone layers by employing a water-softenable polymeric anchoring material between the siliocone and image forming layer. In such a plate, however, the silicone is applied to the substrate as an undercoat or first layer and the anchoring layer, for example, a polyacrylamide, is applied to the silicone layer before the same has cured and is still in a tacky, adhesive condition. Considerable care must be taken in such a procedure to prevent curing of the silicone prior to application of the anchoring material since premature curing will prevent adhesion between the two layers. Adhesion of the photosensitizer layer to the anchoring layer is also difficult to obtain and tannable binders are often employed to aid in this problem.

There thus is a continued need in the art for a planographic plate, capable of printing in the absence of dampening, having less tendency for adhesive failure, that is readily and economically obtainable, that, once prepared, is not susceptible to deleterious action of light and exhibits satisfactory press life.

SUMMARY OF THE INVENTION

The present invention provides a positive-working, presensitized plate for use in waterless or dry planography, capable of being imaged upon exposure to an energy source through an image-bearing or photographic transparency, comprising a substrate having applied to at least one surface thereof (1) as an undercoat layer, a photosensitive composition comprising an epoxysilane, a monomeric or prepolymeric epoxide material and a radiation-sensitive catalyst precursor and (2) as an overcoat layer, an abhesive composition comprising an organo-siloxane and from 0 to 50 percent of an epoxy-silane, said overcoat layer and said undercoat layer, upon exposure to an energy source such as actinic radiation, being firmly bonded one to the other through intra- and inter-layer, in situ, catalytic-initiated polymerization, crosslinking and co-reaction of the organosiloxane, epoxide material and epoxy-silane components.

The invention also relates to planographic printing plates prepared from the presensitized plates above described which are suitable, in the absence of dampening, for accepting ink only in the non-exposed areas and printing therefrom while rejecting ink in the exposed areas, comprising a substrate having bonded thereto an abhesive, ink-repellent surface which comprises a polymerized, solvent-insoluble intra- and interlayer reaction product of said undercoat and overcoat layers above described and to a process for the production thereof.

DESCRIPTION OF DRAWINGS

Referring to the drawings.

DETAILED DESCRIPTION OF THE INVENTION

It has now been discovered that an improved, presensitized, positive-working, planographic printing plate which is capable of printing in the absence of dampening is provided when comprises of a base substrate having bonded thereto the reaction product of an undercoat layer and overcoat layer as above described. The presensitized plate is prepared by coating the substrate with the two layer formulations and curing the coated substrate, preferably by exposure to atmospheric moisture, for a period sufficient to give a dry surface. It has been found that the epoxy-silane when applied as a component of both the undercoat and overcoat layer compositions appears to serve as a coupling agent which, because of its bifunctional nature, can chemically unite the epoxide material and organosiloxane during processing leading to improved interlayer adhesion. Under certain conditions hereinafter defined, the epoxy silane appears to serve this function when applied only as a component of the undercoat layer composition, sufficient amounts of the epoxy-silane apparently being absorbed or diffused to or into the overcoat layer during processing. The presensitized plate thus prepared is ready for exposure and imaging.

Figure 1:
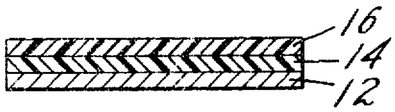
FIG. 1 is a sectional view of a presensitized plate of the invention showing the base substrate, the photosensitive undercoat layer comprising an epoxy-silane, an epoxide material and a catalyst precursor and an overcoat layer comprising an organosiloxane and an epoxysilane.
Figure 2:
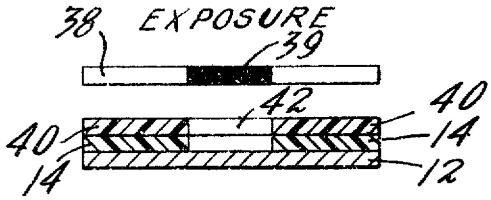
FIG. 2 is a sectional view depicting exposure of the presensitized plate of FIG. 1.

More specifically, the printing plates of the present invention and the method of producing the same may be easily understood by reference to FIGS. 1 to 4. FIG. 1 shows the presensitized plate comprised of a base substrate 12 having coated on at least one surface thereof an undercoat layer composition 14 which is photosensitive and is described more fully hereinbelow. The surface of the undercoat is coated with the overcoat layer composition 16 comprising an organosiloxane and an epoxy-silane or comprising only the organosiloxane. The two layers (14 and 16 in FIG. 1) contain multi-components inter-reactive in and between layers which serve to chemically bond the layers one to the other.

Figure 3:
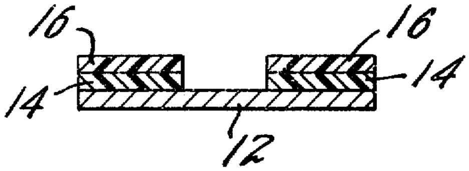
FIG. 3 is a sectional view of a planographic plate of the invention after exposure and development.
Figure 4:
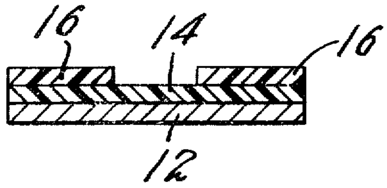
FIG. 4 is a sectional view of an embodiment of the invention wherein the planographic plate after exposure is developed with a solvent in which the organosiloxane layer is soluble and the epoxide polymer is insoluble.

The various layer compositions may be applied by known coating apparatus and procedures such as by whirl-coating, reverse roll coater, blade coater, Mayer bar, knife, etc. to the substrate which may be rigid or flexible, for example paper or other fibrous materials, either natural or synthetic; metals such as aluminum, tinplate, tin-free steel, stainless steel, cold rolled steel; plastics such as polyethylene terephthalate, acrylic resins, nylon, polyester resins, etc. The substrate is thus covered with a film of the sensitized undercoat composition. On exposure to an energy source such as actinic radiation, (FIG. 2) through a positive transparency 38, having a light impermeable area 39, the sensitized composition, which contains an epoxide material, an epoxysilane and a radiation-sensitive catalyst precursor which decomposes upon such exposure to release a Lewis acid effective to initiate polymerization and interaction, is bonded to the overcoat layer through polymerization, crosslinking and interaction of the components of the layers. The thus exposed plate contains a hardened, solvent-insoluble polymerized area 40 corresponding to the exposed area and a solvent-soluble, non-polymerized area 42 corresponding to the nonexposed area. Upon development of the plate, the unexposed epoxide material swells and dissolves, the silicone layer over the epoxide also swells and is removed leaving the bare substrate 12 as illustrated in FIG. 3. In an alternative embodiment of the invention, the plate is developed with a solvent in which the epoxide in the unexposed area is insoluble, the thus developed plate is given a second overall exposure to an energy source to cure the epoxide-material as seen in FIG. 4. Thus either the bare substrate 12 (FIG. 3) or the cured epoxide 14 (FIG. 4) may serve as the ink-receptive printing surface herein while the exposed, polymerized area 42 forms the abhesive non-printing surface.

The Undercoat Layer

The undercoat layer composition comprises (a) a monomeric or prepolymeric epoxide, (b) a radiation-sensitive catalyst precursor, and (c) an epoxy-silane. Any epoxide material or mixture of such epoxide materials, of suitable viscosity alone or when dissolved in a suitable solvent, polymerizable to higher molecular weights may be utilized. While it is recognized that the epoxy-silane component of the formulations of the invention, in a broad sense, is an epoxide material, the term "epoxide material," as employed in the present specification and appended claims is not intended to be inclusive of such compounds which are defined and viewed here primarily as silanes rather than epoxides. Thus monomeric, prepolymeric or resinous epoxides may be employed as the epoxide material herein. The classic epoxy resin is obtained by the well known reaction of epichlorohydrin and bisphenol A (4,4'-isopropylidene diphenol). The reaction product is believed to have the form of a polyglycidyl ether of bisphenol A, (the glycidyl group being more formally referred to as the 2,3-epoxypropyl group) and thus may be thought of as a polyether derived from the diphenol and glycidol (2,3-epoxy-1-propanol). The structure usually assigned to the resinous product is

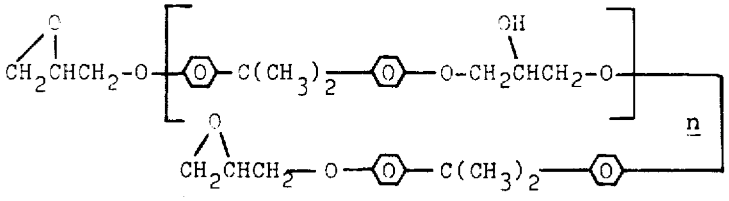

(I)

A viscous liquid epoxy resin, average molecular weight about 380, is obtained by reacting the epichlorohydrin in high molecular proportion relative to the bisphenol A, the reaction product containing well over 85 mole percent of the monomeric diglycidyl ether of bisphenol A ($n$=0), which may be named 2,2-bis[p-(2,3-epoxypropoxy)phenyl]propane, and smaller proportions of polymers in which $n$ is an integer equal to 1,2,3, etc. This product exemplifies epoxide monomers and prepolymers, which may be cross-linked or otherwise polymerized in accordance with the invention, whereby cleavage of the terminal epoxy or oxirane rings is initiated by the action of the Lewis acid halide released when energy is applied to the latent polymerization catalyst.

Many other epoxide materials are available in polymerizable monomeric or prepolymeric forms. Among these are 1,2-epoxycyclohexane (cyclohexane oxide, also named 7-oxabicyclo[4.1.0]heptane) and vinylcyclohexane dioxide, more specifically named 3-(epoxyethyl)cyclohexane. Ethylene oxide (oxirane,

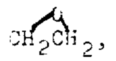

the simplest epoxy ring) and its homologues generally, e.g., propylene oxide (1,2-epoxypropane) and 2,3-epoxybutane, are themselves useful. Other epoxidized cycloalkenes may be used, a readily available polycyclic diepoxide being dicyclopentadiene dioxide, more specifically identified as 3,4-8,9-diepoxytricyclo[5.2.1.0$^{2,6}$] decane.

Glycidyl esters of acrylic acid and of its homologs, methacrylic acid and crotonic acid, are vinyl epoxy monomers of particular interset. Other such monomers are allyl glycidyl ether (1-allyloxy-2,3-epoxypropane) and copolymers thereof with glycidyl methacrylate particularly as disclosed and claimed in co-pending U.S. Application, Ser. No. 297,829 filed Oct. 16, 1972, as well as glycidyl phenyl ether (1,2-epoxy-3-phenoxypropane). Another readily available product is a mixture of ethers of the structure

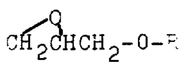

where R is alkyl, that is, glycidyl alkyl ethers. One such mixture contains predominantly glycidyl octyl ether and decyl glycidyl ether; another contains dodecyl glycidyl ether and glycidyl tetradecyl ether. Epoxidized novolak and epoxy cresol novolak prepolymers likewise may be used, as well as polyolefin (e.g., polyethylene) epoxides. The latter are exemplified by epoxidized, low molecular weight by-products of the polymerization of ethylene, which may be separated as mixtures high in 1-alkenes in the range from about 10 to 20 carbon atoms, that is from about 1-decene to about 1-eicosene. Epoxidation then provides mixtures of the corresponding 1,2-epoxyalkanes, examples being mixtures high in the 1,2-epoxy derivatives of alkanes having 11 to 14 carbons, or having 15 to 18 carbons.

Esters of epoxidized cyclic alcohols, or of epoxidized cycloalkanecarboxylic acids, or of both, provide useful epoxide or polyepoxide materials. Thus a suitable ester of epoxidized cyclohexanemethanol and epoxidized cyclohexanecarboxylic acid is the diepoxide (3,4-epoxycyclohexyl)methyl 3,4-epoxycyclohexanecarboxylate. Another suitable diepoxide may be obtained as an ester of a substituted (epoxycycloalkyl)methanol and a dibasic acid, for example, bis[3,4,-epoxy-6-methylcyclohexyl)methyl ] adipate, which may be named alternatively bis[4-methyl-7-oxabicyclo-[4.1.0]hept-3-yl)methyl] adipate. Diepoxide monomeric materials may be obtained conveniently as bis(epoxyalkyl)ethers of glycols, an example being the diglycidyl ether of 1,4-butanediol, that is, 1,4-bis-(2,3-epoxypropoxy)butane). This diepoxide is related to the diglycidyl ether of bisphenol A, shown above as 2,2-bis[p-(2,3-epoxypropoxy)phenyl]propane.

The materials utilized as latent polymerization initiators in the process and compositions of the present invention are radiation-sensitive catalyst precursors which decompose to provide a Lewis acid upon application of energy. The energy required for effective decomposition may be energy applied by bombardment with charged particles, notably by high-energy electron beam irradiation. Preferably, however, the catalyst precursors are photosensitive, and the required energy is imparted by actinic irradiation, which is most effective at those regions of the electromagnetic spectrum at which there is high absorption of electromagnetic energy by the particular catalyst precursor used. More than one of these types of energy may be applied to the same system; e.g., ultraviolet light irradiation followed by electron beam irradiation, may be employed, although ultraviolet irradiation ordinarily can effect a suitable cure.

The preferred photosensitive Lewis acid catalyst precursors are aromatic diazonium salts of complex halogenides, which decompose upon application of energy to release a halide Lewis acid. The aromatic diazonium cation may be represented generally as $[Ar\text{-}N \equiv N]^+$, where the aryl group Ar, which may be an alkaryl hydrocarbon group, is bonded to the diazonium group by replacing one of the hydrogen atoms on a carbon atom of the aromatic nucleus, and where the aryl group ordinarily carries at least one pendant substituent for greater stability of the cation. Thus the pendant substituent may be alkyl, or another substituent, or both. The complex halogenide anlon may be represented by $[MX_{n+m}]^{-m}$. Thus, the photosensitive salt and its decomposition upon actinic irradiation may be depicted as follows: $[Ar\text{-}N \equiv N]_m[MX_{n+m}]^{-m} \xrightarrow{h\nu} mAr\text{-}X + mN_2 + MX_n$ (1)
where X is the halogen ligand of the complex halogenide, M is the metallic or metalloid central atom thereof, $m$ is the net charge of the complex halogenide ion, and $n$ is the number of halogen atoms in the halide Lewis acid compound released. The Lewis acid halide $MX_n$ is an electron pair acceptor, such as $FeCl_3$, $SnCl_4$, $PF_5$, $AsF_5$, $SbF_5$, and $BF_3$ etc., which upon suitable irradiation of the diazonium complex salt is released in substantial quantities and initiates or catalyzes the polymerization process, wherein the monomeric or prepolymeric material is polymerized, crosslinked and interacted as the result of the actinic irradiation.

The diazonium compounds of the present invention may be prepared using procedures known in the art, as disclosed in U.S. Pat. No. 3,708,296 issued Jan. 2, 1972 to S. Schlesinger and commonly assigned herewith and such preparation forms no part of the present invention.

Illustrative of the aromatic diazonium cations comprised in the photosensitive catalyst salts utilized in accordance with the present invention are the following:

p-chlorobenzenediazonium
2,4-dichlorobenzenediazonium
2,5-dichlorobenzenediazonium
2,4,6-trichlorobenzenediazonium
o-nitrobenzenediazonium
p-nitrobenzenediazonium
4-nitro-o-toluenediazonium (2-methyl-4-nitrobenezenediazonium)
p-methoxybenzenediazonium
o-methoxybenzenediazonium
6-nitro-2,4-xylenediazonium (2,4-dimethyl-6-nitrobenzenediazonium)

2-chloro-4-(dimethylamino)-5-methoxybenzenediazonium
4-chloro-2,5-dimethyoxybenzenediazonium
2,4',5-triethoxy-4-biphenyldiazonium (2,5-diethoxy-4-(p-ethoxyphenyl)benzenediazonium)
2,5-dimethoxy-4'-methyl-4-biphenyldiazonium (2,5-dimethoxy-4-(p-tolyl)benzenediazonium)
2,5diethoxy-4-(phenylthio)benzenediazonium
2,5-diethoxy-4-(p-tolylthio)benzenediazonium
2,5-diethoxy-4-(p-tolylmercapto)benzenediazonium
p-morpholinobenzenediazonium
2,5-dichloro-4-morphollnobenzenediazonium
2,5-dimethoxy-4-morpholinobenzenediazonium
4-(dimethylamino)-naphthalenediazonium Illustrative of the complex halogenide anions comprised in the photosensitive catalyst salts utilized in accordance with the present invention are the following:

tetrachloroferrate(III), $FeCl_4^-$
hexachlorostannate (IV), $SnCl_6^{2-}$
tetrafluoroborate, $BF_4^-$
hexafluorophosphate, $PF_6^-$
hexafluoroarsenate(V), $AsF_6^-$
hexafluoroantimonate(V), $SbF_6^-$
pentachlorobismuthate(III), $BiCl_5^{2-}$ A section of aromatic diazonium salts of complex halogenides is listed in Table I. Many of the salts listed have been found to be well adapted or superior for use as latent photosensitive polymerization initiators in the process and compositions of the present invention, based on thermal stability, on solubility and stability in the monomer formulations and solvents used, on photosensitivity, and on ability to effect polymerization and interaction after adequate actinic irradiation. Following the name of each aromatic diazonium halogenide is its melting point or decomposition temperature in degrees centigrade, and wavelengths of electromagnetic radiation, in nanometers, at which it exhibits absorption maxima.

TABLE I

| | M.P.,[1] °C | ABs'n Max., nm. |
|---|---|---|
| 2,4-dichlorobenzenediazonium tetrachloroferrate(III) | 62–64 | 259,285,360 |
| p-nitrobenzenediazonium tetrachloroferrate(III) | 93–95 | 243, 257, 310, 360 |
| p-morpholinobenzenediazonium tetrachloroferrate(III) | 121.5 | 240, 267, 313, 364 |
| 2,4-dichlorobenzenediazonium hexachlorostannate(IV) | 190 | 285 |
| p-nitrobenzenediazonium hexachlorostannate(IV) | 126 | 258, 310 |
| 2,4-dichlorobenzenediazonium tetrafluoroborate | 152 | 285, 325–340 (shoulder) |
| p-chlorobenzenediazonium hexafluorophosphate | 162–164 | 273 |
| 2,5-dichlorobenzenediazonium hexafluorophosphate | dec. 140 | 264, 318 |
| 2,4,6-trichlorobenzenediazonium hexafluorophosphate | 240–250 | 294, 337 |
| 2,4,6-tribromobenzenediazonium hexafluorophosphate | 245–260 | 306 |
| p-nitrobenzenediazonium hexafluorophosphate | 156(178)[1] | 258, 310 |
| o-nitrobenzenediazonium hexafluorophosphate | 161.5 | |
| 4-nitro-o-toluenediazonium hexafluorophosphate | 123(138) | 262, 319 |
| 2-nitro-p-toluenediazonium hexafluorophosphate | 164–165 | 286 |
| 6-nitro-2,4-xylenediazonium hexafluorophosphate | 150 | 237, 290 |
| p-morpholinobenzenediazonium hexafluorophosphate | 162(181) | 377 |

TABLE I – Continued

| | M.P.,[1] °C | ABs'n Max., nm. |
|---|---|---|
| 4-chloro-2,5-dimethoxybenzenediazonium hexafluorophosphate | 168–169 (198–208) | 243 (shoulder), 287, 392 |
| 2,5-dimethoxy-4-morpholinobenzenediazonium hexafluorophosphate | Above 135 | 266, 396 |
| 2-chloro-4-(dimethylamino)-5-methoxybenzenediazonium hexafluorophosphate | 111 | 273, 405 |
| 2,5-dimethoxy-4-(p-tolylthio)benzenediazonium hexafluorophosphate | 146(155) | 358, 400 |
| 2,5-diethoxy-4-(p-tolylthio)benzenediazonium hexafluorophosphate | 147(150) | 223 (shoulder), 247, 357, 397 |
| 2,5-dimethoxy-4'-methyl-4-biphenyldiazonium hexafluorophosphate | 167 | 405 |
| 2,4',5-triethoxy-4-biphenyldiazonium hexafluorophosphate | 136 | 265, 415 |
| 4-(dimethylamino)-1-naphthalenediazonium hexafluorophosphate | 148 | 280, 310, 410 |
| p-nitrobenzenediazonium hexafluoroarsenate(V) | 141–144 (161) | 257, 310 |
| p-morpholinobenzenediazonium hexafluoroarsenate(V) | 162 (176–177) | 257, 378 |
| 2,5-dichlorobenzenediazonium hexafluoroantimonate(V) | 161–162.5 | 238, 358 |
| p-nitrobenzenediazonium hexafluoroantimonate(V) | 140–141 | 257, 308 |
| p-morpholinobenzenediazonium hexafluoroantimonate(V) | 153 (177.5–180.5) | 254, 374 |
| 2,4-dichlorobenzenediazonium hexachloroantimonate(V) | 178–180 | 279, 322 (shoulder) |
| p-nitrobenzenediazonium fluoroborate | 140(148–50) | 258, 311 |
| 2,5-diethoxy-4-(p-tolylthio) benzenediazonium fluoroborate | 150(157) | 354, 403 |
| p-N-morpholino benzenediazonium fluoroborate | 155(163) | 257, 375 |
| 2,4-dichlorobenzenediazonium pentachlorobismuthate(III) | 193.5–195 | 285, 313 |
| o-nitrobenzenediazonium pentachlorobismuthate(III) | 166.5–168 | 285, 313 |

Note [1] - The melting points given in Table I were determined generally by the usual visual capillary tube method; in most cases discoloration began below the observed melting point.

The epoxy-silane as used in this invention as a component of the overcoat and/or undercoat layer may be characterized as compounds containing a central silicon atom with at least one epoxy group attached thereto, either directly or through a hydrocarbyl or hydrocarbyloxy group. The silanes contain additionally at least two hydrocarbyloxy groups which are hydrolyzable to yield a polysiloxane. such compounds may be characterized by the general formula

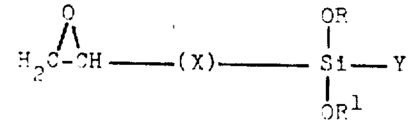
(II)

wherein each of X, R and $R_1$ is an alkylene, alkoxy, arylene, alkarylene, aralkylene, carbalkoxy, ether, $(R_1OR_1-)$, diether, for example $-O-R_1-O-R_1-$ wherein $R_1$ is the same as X, etc; and Y may be alkoxy or an epoxy group. Especially preferred as those compounds wherein each of X, R and $R_1$ are alkylene radicals.

In general, such compounds suitable for use herein will include epoxy alkyl ethers of alkyl silanes such as glycidoxypropyltrimethoxysilane, glycidoxypropyltriethoxysilane glycidoxypropylvinyldimethoxysilane; reaction products of silanes such as methyl, vinyl, allyl or ethyl silane with unsaturated epoxides such as epoxybutene or allylglycidyl ether, etc. especially preferred herein is glycidoxypropyltrimethoxysilane.

The Overcoat Layer

The overcoat layer is comprised of an organosiloxane or organosiloxane precursor and from about 0 to 50 percent of an epoxy-silane.

Organosiloxanes suitable for use in the present invention are well known. Essentially, they are known as silicone elastomers formed from the cure or further polymerization of silicone gums.

Organosiloxanes, formed by further polymerizing, crosslinking or curing the gums, can be characterized generally as the sparsely crosslinked dialkyl polysiloxanes of high molecular weights (generally about 400,000 to 800,000)having a R/Si ratio of about 2.0, generally below 2.1 and above 1.95. Representative silicone gums include the diorganopolysiloxanes having the central repeating linear unit

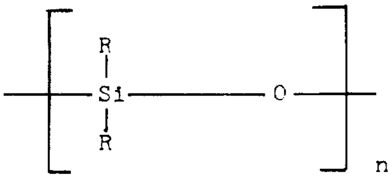
(III)

wherein n may be from 2 to 20,000 or higher and where R may be the same or different radicals such as alkyl, aryl, halogenated alkyl or aryl, cyano alkyl, Corning) etc., the major proportion of R usually being methyl groups. Any of such substances having abhesive properties, e.g., being good release agents, when cured and which are oleophobic in nature may be used herein.

Such organosiloxanes suitable for use herein may be filled or unfilled and may include (Dow corning) DC92-009; DC-92-048; Silastics 734 and 236 (General Electric) SE-76, RTV-108, RTV-154, RTV Rubbers A, B, C, D and E, RTV-118, etc.

The epoxy-silane component of this layer may be characterized as in Formula II hereinabove. when present in both layers, such compounds in the various layers may be the same or different.

Proportions of the components of the coating compositions employed to obtain the undercoat and overcoat layers above described may vary as desired.

The overcoat layer formulation may contain from 0 to 50 percent by weight of an epoxy-silane, preferably 10 to 50. The relative amounts of organosiloxane added to epoxy-silane may vary from about 50 to 100 percent, preferably from about 60 to 100 percent by weight.

The proportions of the components of the undercoat layer are dependent on the amount of epoxy-silane added in the overcoat layer. When the epoxy-silane is added as a component of the overcoat layer composition, the relative amounts of epoxide material to epoxy-silane present in the undercoat formulation may vary from about 80 to 99 percent, preferably from about 85 to 90 percent by weight percent by weight epoxide material to about 1 to 20 percent, preferably 10 to 15 percent by weight epoxy-silane and the amount of catalyst precursor will vary from about 0.5 to 10 percent, preferably 3 to 7 percent of the total epoxide content, e.g., epoxy derived from the epoxide material as well as the epoxy-silane.

When the epoxy-silane is not added as a component of the overcoat layer, the epoxy-silane must be present in the undercoat layer in amounts equal to at least 25 percent by weight of the epoxide material. The relative amounts of epoxide material to epoxy-silane may then vary from about 25 to 75 percent, preferably 45 to 55 percent by weight 45 to 55 percent by weight epoxide material to about 25 to 75 percent, preferably 45 to 55 percent epoxy-silane by weight of the epoxide material and the amount of catalyst precursor may vary from 15 to 40 percent, preferably 20 to 25 percent by weight of the epoxide material.

In the embodiment of the invention where the epoxy-silane is omitted from the overcoat layer formulation, the parameters relative to proportions are critical to the successful operation of the invention. Thus, where the overcoat formulation is devoid of epoxy-silane, it is essential that the catalyst precursor be present in an amount of from about 15 to 40 percent by weight of the epoxide material since it has been found that about 12 percent or less in such a formulation results in poor adhesion between the layers. Ordinarily, in those cases where the epoxy-silane is a component of both the overcoat and undercoat formulations, high catalyst concentrations, e.g., concentrations much in excess of 10% are to be avoided. Such excesses are only tolerated and necessary in the embodiment of the invention where the epoxy-silane is not added as a component of the overcoat formulation. Secondly, in such an undercoat, the epoxy-silane coupler present is required in a concentration of at least 25 percent and preferably about 50 percent by weight of the eposide material. Amounts substantially less, for example, 20 percent results in poor adhesion between layers. Additionally, when the overcoat formulation solution is devoid of epoxy-silane, best results are obtained when the components of said layer are applied with certain solvent mixtures. Particularly effective in this embodiment are mixtures of toluene, cyclohexane and n-hexane and related solvents in proportions of about 50:50:20 respectively.

The procedure for admixing the components of the various layers are relatively simple.

The undercoat components, e.g., epoxide material, diazonium catalyst precursor and epoxy-silane are generally dissolved in a suitable inert carrier or solvent. By a suitable inert solvent is meant one that does not react appreciably with the components of the layer. Examples of such solvents include butyronitrile, acetonitrile, toluene, hexane, o-chlorotoluene o-dichlorobenzene, cyclohexane, dimethyl ether of diethylene glycol, anisole, acetone, xylene, methyl ethyl ketone, 1,1,2,2-tetrachloroethane, monochlorobenzene, trichloroethylene, propylene carbonate, etc. Mixtures of these solvents may be employed.

In the overcoat, the organosiloxane and epoxy-silane, when a component of the formulation, are applied by means of suitable solvents or diluents which are preferably aromatic or aliphatic hydrocarbons including heptane, hexane, VMP naphtha, toluene, cyclohexane, xylene, etc. and mixtures thereof.

The layers may be applied at various thicknesses as desired. For the overcoat, thicknesses of 0.0003 inch to about 0.0012 inch have been found to be suitable. Thicker films, may of course be applied but will be more difficult to develop. The undercoat layer may vary from the thinnest possible layer that covers the substrate to a maximum of about 0.0003 inch or higher if desired although such higher amounts are not usually necessary. It is a feature of the instant invention that thicker filmls of organosiloxane may be employed, thereby giving longer plate life, without undue difficulty in development since the unexposed epoxy undercoat swells upon development putting the organosilicone in a strained condition enabling easier removal from the plate.

While not wishing to be bound by any theory of the mechanism responsible for the operation of the invention, it is believed that the improved adhesion of the instant plates is a result of in situ reaction between the components of the various layers in the sense of both inter- and intra-layer reaction with the epoxy-silane component functioning as a coupler. In a typical procedure after the two coatings are applied, the presensitized plate is exposed to atmospheric moisture to cure the organosilicone to give a dry, hard surface according to equation (2):

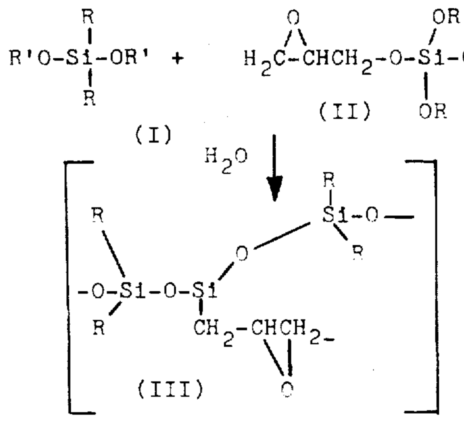

(2)

The cured silicone III has pendant epoxy groups available for further crosslinking. After exposure to an energy source, which penetrates to the undercoat and releases the Lewis acid [MX]*n* from the photolyzed diazonium resin contained therein to effect polymerization and crosslinking of the epoxide, the mechanism is believed to be as in equation (3):

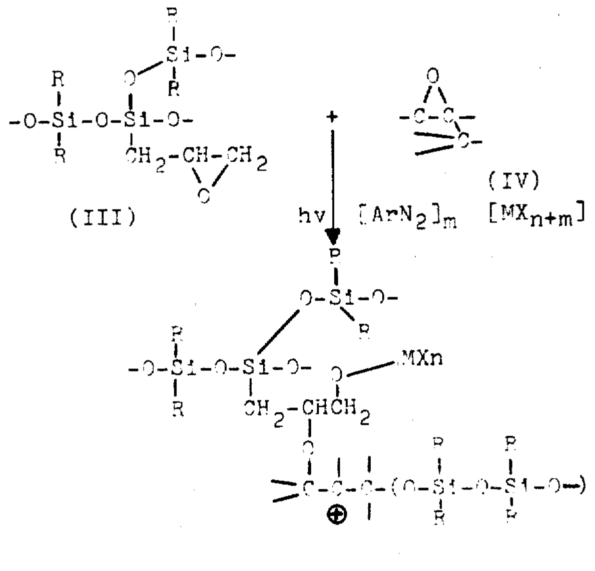

(V)

(3)

The epoxy groups of the silicone from the overcoat and undercoat (III) are believed to crosslink with the epoxy groups of the epoxide material of the undercoat (IV) to give the crosslinked structure (V) with further cross-linking and reaction occurring through additional hydroxyl groups, if present and -Si-O- groups. Although, in one embodiment of the invention, the overcoat layer solution as applied may be devoid of epoxy-silane coupler, it is believed that some amount of epoxy-silane is necessarily present in the top layer either by diffusion or absorption thereto from the undercoat. It is further believed that epoxy groups present in the epoxy-silane are participating in a chain polymerization reaction of epoxy groups which originates in the bottom layer and at the interface between layers and continues via the presence of some amount of epoxy-silane in the top layer even when such component is not added as a component of the overcoat formulation. The fact that catalyst and coupler concentrations employed when the overcoat formulation applied does not contain the epoxy-silane as a component are much higher than when the epoxy-silane is added as a component of the formulation is, we believe, a strong indication of in situ, inter- and intra-layer bonding and reaction.

The source of radiation for carrying out the method of the present invention can be any suitable source, such as the ultraviolet actinic radiation produced from a mercury, xenon, or carbon arc, or the electron beam produced by a cathode ray gun. The only limitation placed on the radiation source used is that it must have an energy level at the irradiated film sufficient to impart to the polymerizable system energy at an intensity high enough to reach the decomposition level of the photosensitive compounds. As previously noted, the wavelength (frequency) range of actinic radiation is chosen to obtain sufficient absorption of energy to excite the desired decomposition.

The exposed plate may be developed by employing any of various solvents which swell and soften the silicone layer for removal and which may dissolve the epoxide material as well, if desired, leaving the bare substrate as the ink-receptive printing surface. In an embodiment of the invention, as illustrated further hereinbelow, the plate may be developed by treatment with a solvent which swells and softens the silicone but in which the epoxide is insoluble in which case the epoxide material in the initially unexposed area, after an additional overall exposure to cure the epoxide in this area, remains on the substrate and becomes the ink-receptive printing surface. Solvents suitable for development of the plate include xylene, trichloroethylene, cyclohexane, acetone, etc.

The following examples will serve to further illustrate the present invention.

Example I

An overcoat solution was formulated to contain:

400 ml. n-hexane 400 ml. toluene 22 g. glycidoxypropyltrimethoxysilane 200 g. Dow Corning 92-009 silicone dispersion (supplied as 33% silicone) and the thus prepared formulation was diluted with an equal volume of cyclohexane.

Two undercoat solutions were formulated to contain:

A. 180.2 of a 12% solution of ECN1299 epoxy resin (an epoxy-cresol novolac) in a 6:1 mixture of butyronitrile and o-chlorotoluene 2.594 g. glycidoxypropyltrimethoxysilane 1.08 g. 2,5-diethoxy-4-(p-tolylthio)benzene diazoniumm hexafluorophosphate and B 177.4 g. of a 15% solution of Araldite 6084 epoxy resin (a poly(bis-phenol A-glycidyl ether derivative) in a 6:1 mixture of butyronitrile and o-chlorotoluene 75.8 g. butyronitrile 1.33 g. of 2,5-diethoxy-4-(p-tolylthio) benzene diazonium hexafluorophosphate 3.192 g. glycidoxypropyltrimethoxysilane.

An undercoat layer was formed by whirl-coating two chromated aluminum lithoplates with formulations A and B respectively at a whirler speed of 100 rpm with the temperature maintained at 30°C by means of a hot air blower. After drying the plates for 15–20 minutes at 30°C, the overcoat was applied to each plate at 100 rpm. The coated presensitized plates were stored for 24 hours to permit curing of the overcoat to a dry surface.

Samples of the coated plates were exposed for 30 seconds in contact with a Kodak No. 2 step tablet, using a 360 W "Uviarc" mercury arc lamp at 20 cm. distance. Following exposure, the plates were heated for 3 minutes at 110°C and then developed in xylene while being rubbed with cheesecloth followed by a final rinse with acetone.

The sample prepared from undercoat A had 12 steps reproduced and that of undercoat B had 10 steps reproduced. Both samples showed excellent release properties when tested with Scotch tape, i.e, the tape would not adhere to plate areas bearing the coating. Adhesion of the tape to the non-exposed areas was excellent.

Another sample of the two plates was given 10 seconds exposure through a half-tone transparency image and processed as above. The sample produced an excellent copy of the image in the form of a silicone coating. These plates when rolled with ink accepted ink only on the non-silicone areas and printed several copies giving excellent, visible, positive images consisting of the colorless silicone on a colored background.

When plates were prepared from the above formulations but omitting the epoxy-silane from the overcoat and undercoat layers, both samples showed good release properties when tested with Scotch tape before development but adhesion between layers failed, e.g., the silicone layer and the epoxide layer came off, when subjected to the stress created by rapidly splitting the inks during the printing procedure. Moreover, when the epoxy-silane was omitted either from the overcoat or undercoat layer under the conditions of example 1, the silicone layer came off during development.

Example 2

Example 1 was repeated except that samples of the exposed plates were developed in cyclohexane while omitting the final acetone rinse leaving the epoxy resin in the unexposed areas since this is insoluble when developed in cyclohexane. The thus developed plates were then given an overall exposure for 30 seconds to cure the epoxy-coated areas which were left to form the oleophilic, printing surface.

Example 3

An overcoat was formulated to contain:

57.5 g Dow Corning 92-009 silicone dispersion (applied as 33% silicone)

0.384 g glycidoxypropyltrimethoxysilane 115.0 ml. toluene 415 ml. cyclohexane

The overcoat solution was employed with undercoat solutions A and B, respectively, of Example 1. When the layers were applied to aluminum lithoplates, cured, exposed and developed employing the same procedure and ingredients as in Example 1, comparable results as reported therein were obtained.

Example 4

An undercoat solution was formulated to contain:

15 g Araldite 6084

1.80 g glycidoxypropyltrimethoxysilane 0.75 g 2,5-diethoxy-4-(p-tolyl-thio)benzene diazonium hexafluorophosphate 85 g butyronitrile This solution was employed to whirl-coat a chromated aluminum lithoplate at about 70 rpm whirler speed. After allowing the undercoat to dry at room temperature for one hour, it was coated over at 200 rpm with an overcoat solution composed of 10 g Dow Corning 92-009 silicone dispersion 1.1 g of glycidoxypropyltrimethoxysilane 29 ml. toluene 20 ml. n-hexane The completed presensitized plate was stored in the dark for 24 hours to permit curing of the silicone by reaction with atmospheric moisture.

A sample of the plate was exposed through a Kodak No. 2 step tablet for 15 seconds to a 360 W "Uviarc" mercury lamp at about 10 cm. distance. It was then heated at 110°C for two minutes. After cooling, the sample was immersed in xylene and rubbed with cheesecloth while in the xylene. After rinsing with acetone and drying, the plate sample showed a length of silicone coating corresponding to the first 5 steps of the step tablet. The abhesive nature of this coating was illustrated by failure of Scotch brand transparent adhesive tape to adhere to it although adhesion to the non-exposed areas was excellent.

Another sample of this plate was given 10 seconds exposure through a half-tone transparency image, and heated at 110°C for 2 minutes. Development with xylene and acetone as in the first sample produced an excellent copy of the image in the form of a silicone coating. When rolled with ink, ink was accepted only on the non-silicone areas, and an excellent positive image was visible consisting of the colorless silicone on a colored background.

Example 5

An undercoat solution was formulated to contain:

24 g ECN 1299

29.3 g o-chlorotoluene 146.7 g butyronitrile 1.20 g 2,5-diethoxy-4-(p-tolylthio)benzene diazonium hexafluorophosphate 2.88 g glycidoxypropyltrimethoxysilane and an overcoat solution was formulated of 20 g DC-92-009 silicone disperson 75 ml. toluene 75 ml. n-hexane 2.2 g glycidoxypropyltrimethoxysilane A ball-grained aluminum litho plate was whirl-coated with the underocat formulation at 60 rpm. After drying, this coat was overcoated with the overcoat formulation also at 60 rpm. The plate was allowed to interact with atompheric moisture for 24 hours before processing.

The plate was exposed through a half-tone transparency image for 30 seconds to a Xenon lamp and then heated for 2 minutes at 110°C. It was then immersed, after cooling, in xylene and rubbed with cheesecloth. After rinisng with acetone and drying, a very good reproduction of the original image was obtained with silicone remaining on the exposed areas while non-exposed area were bare metal substrate.

A sample of this plate was used to print copies on a lithographic printing press without a fountain solution, only ink being required. No further preparation of the printing plate was carried out after its development and it was immediately ready for the press. The prints made were positive copies of the original image on the transparency used to expose the presensitized plate.

Example 6

This example illustrates preparation formulated use of a plate wherein the epoxy-silane is omitted from the overcoat formulation.

An overcoat solution was formuaed to contain:

50 g toluene
50 g cyclohexane
20 g n-hexane
15 g DC-92009 silicone dispersion

The underocat solution was formulated to contain:

6 g ECN1299 epoxy resin
3 g glycidoxypropyltrimethoxysilane
1.5 g 2,5-diethoxy-4-(p-tolythio)benzene diazonium hexafluorophosphate The undercoat and overcoat layers were applied to brush grained aluminum, dried, exposed for 20 seconds to a 2000W Cold mercury lamp through a transparency employing the same procedures of exposure and post-heating as in Example 1. After cooling, the plates were developed by immersion in trichloroethylene and rubbing with cheesecloth to remove the organosiloxane and epoxide in the non-exposed areas leaving the bare metal substrate as the printing surface.

The samples produced an excellent copy of the image and showed excellent release properties when tested with Scotch tape before development. Adhesion of the tape to the non-exposed areas was excellent.

The plate thus prepared was used to print copies on a lithographic printing press without a fountain solution and without adhesive failure of the layer during the printing operation.

Example 7

To illustate the criticality of relative proportions when the epoxy-silane is omitted from the overocat formulation, the following formulations differing only in proportions of catalyst and coupler were made and applied to an aluminum substrate following the procedure of Example 6. All plaes were overcoated with a topcoat consisting of:

50g. toluene
20g. n-hexane
50g. cyclohexane
15g. DC-92009 silicone dispersion

The coated substrates were exposed for 20 seconds to a 2000 W. Cold mercury lamp, heated after exposure to 230°F for ten minutes and developed in trichloroethylene. The results are indicated in Table II which follows.

TABLE II

| Undercoat Formulation | Plate 1 | Plate 2 | Plate 3 | Plate 4 |
|---|---|---|---|---|
| a) chlorotoluene | 50g. | 50g. | 50g. | 50g. |
| b) butyronitrile | 250g. | 250g. | 250g. | 250g. |
| c) ECN-1299 | 6g. | 6g. | 6g. | 6g. |
| d) Catalyst* | 1.59 (25% of epoxy) | .3 (5% of epoxy) | .3g (5% of epoxy) | 1.59 (25% of epoxy) |
| e) Coupler** | 3g. (50% of epoxy) | .6g (10% of epoxy) | 3g (50% of epoxy) | .6 (10% of epoxy) |
| Results | Note (1) | Note (2) | Note (3) | Note (4) |

Notes:
(1) Strong, defect-free image
(2) Adhesion between coats failed completely during development
(3) Partial adhesive failure during development; plate highly susceptible to scratching during development

*2,5-diethoxy-(p-tolylthio)benzenediazonium hexafluorophosphate
**glycidoxypropyltrimethoxysilane Example 8

A printing plate was made using the same formulation and procedure as described in Example 6 except that Dow Corning RTV 734 silicone was substituted for the DC-92-009 silicone therein. The resultant plate, though more difficult to develop than that of Example 6, nevertheless exhibited superior adhesion between layers during and after development and had excellent scratch and abrasion resistance.

Example 9

This example illustrates preparation of a flexible plate.

An undercoat was formulated to contain:

274 g of 8% ECN1299 epoxy resin in a 6:1 butyronitrile /o-chlorotoluene mixture
2.63 g. glycidoxypropyltrimethoxysilane
1.10 g. 2,5-diethoxy-4-(p-tolylthio) benzene diazonium hexafluorophosphate An overocat was formulated to contain:

57.5 G. Dow Corning DC-92009 silicone dispersion
115 ml. toluene
415 ml. cyclohexane
6.33 g. glycidoxypropyltrimethoxysilane.

The undercoat solution was whirl-coated on "Cronar" (polyethylene terephthalate film) at 100 rpm and dried for 30 minutes. The overcoat was then applied at the same speed. The plate was permitted to dry in contact with atmospheric moisture for 3 days.

A contact-exposure of a half-tone and line test pattern was made using a 360 W Uviarc mercury arc as the energy source. Exposure through the image transparency was for 50 seconds at 22 cm. distance. The exposed plate was then heated at 120°C for 3 minutes after which it was developed by soaking the plate in cyclohexane for 3 minutes, and rubbing off the non-exposed silicone areas with solvent-saturated cheescloth.

The resulting image was clear in the exposed areas and hazy in the non-exposed areas, from which the overcoat was removed. The developed image was then exposed overall to the Uviarc lamp to cure the remaining epoxy undercoat which was permitted to remain in the unexposed areas. The epoxy resin in the intially non-exposed area remained to form the ink-receptive surface in the non-exposed areas.

Alternatively, the epoxide was removed from the non-exposed areas by trichloroethylene, leaving the Cronar as the ink-receptive surface.

The flexible plate thus prepared is of special advantage in use due to its economy, when compared with metal plates, and provides easier shipment since it can be rolled and, of course, is light-weight.

It is thought that the invention and many of its attendant advantages will be understood from the foregoing description and it wil be apparent that various changes may be made in the matter of ingredients, the identity and the proportions of the formulations, and that changes may be made in the form, construction and arrangement of the parts of the article without departing from the spirit and scope of the invention or sacrificing all of its material advantages, the forms hereinabove described being merely preferred embodiments thereof.

We claim:

1. A presensitized planographic printing plate capable of being imaged comprising a substrate having applied to at least one surface thereof:

1. as an undercoat layer, a sensitized composition comprising an epoxy-silane, a monomeric or prepolymeric epoxide material polymerizable to higher molecular weights through the action of a cationic catalyst, and, as a catalyst precursor, a radiation-sensitive aromatic diazonium salt of a complex halogenide which decomposes upon application of energy to release a Lewis acid effective to initiate polymerization and interaction of said epoxide and epoxy-silane and
2. as an overcoat layer, an abhesive compisition comprising an organosiloxane and from 0 to 50 percent of an epoxy-silane as based on the total weight of the components in the overcoat layer said epoxy-silane in said layers being selected from compounds having the general formula

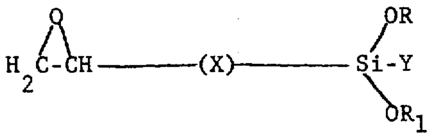

with the proviso that (1) when said overcoat layer composition is devoid of epoxy-silane, said undercoat layer composition contains about 25 to about 75 percent epoxy-silane and about 15 to about 40 percent of said catalyst precursor, and (2) when said epoxy-silane is a component of said overcoat layer composition, said undercoat layer composition contains about 1 to about 20 percent epoxy-silane and about 0.5 to about 10 percent of said catalyst precursor, all percents being based on the total weight of said epoxide material in said undercoat layer except the percent of said catalyst precursor in proviso (2) is based on the total weight of epoxide moiety containing compounds in said undercoat layer wherein each of X, r and $R_1$ is an alkylene, alkoxy, arylene, alakarylene, aralkylene, carbalkoxy or ether group and Y is an alkoxy or epoxy group; said undercoat layer becoming firmly bonded to said overcoat layer throughintra- and inter-layer reaction upon exposure of said coated substrate to an energy source.

said organosiloxane being silicone elastomer formed by curing and/or polymerizing silicone gum;

said undercoat layer becoming firmly bonded to said overcoat layer through intra- and inter-layer reaction upon exposure of said coated substrate to an energy source.

2. A presensitized printing plate as claimed in claim 1 wherein said catalyst precursor is 2,5-diethoxy-4-(p-tolylthio)-benzenediazonium hexafluorophosphate.

3. A presensitized printing plate as claimed in claim 1 wherein said epoxide material is selected from the group consisting of epoxy-novolacs and glycidyl ethers of bisphenol A.

4. A presensitized plate as claimed in claim 2 wherein said epoxy-silane is glycidoxypropyltrimethoxy silane.

5. A presensitized plate as claimed in claim 1 wherein said overcoat layer as applied is devoid of epoxy-silane.

6. A presensitized plate as claimed in claim 5 wherein said epoxy-silane present in said undercoat is glycidoxy-propyltrimethoxysilane.

7. A presensitized plate as claimed in claim 6 wherein said catalyst precursor is 2,5-diethoxy-4(p-tolylthio)-benzenediazonium hexafluorophosphate.

8. A presensitized plate as claimed in claim 1 wherein said overcoat layer comprises from about 10 to 50% by weight of said epoxy-silane.

9. A presensitized plate as claimed in claim 8 wherein said epoxy-silane is glycidoxypropyltrimethoxysilane.

10. A presensitized plate as claimed in claim 9 wherein said catalyst precursor is 2,5-diethoxy-4-(p-tolylthio) benzenediazonium hexafluorophosphate.

11. A presensitized plate as claimed in claim 1 wherein said substrate is metal, plastic or paper.

12. A presensitized printing plate capable of being imaged comprising a substrate having applied thereto:

1. As an undercoat layer, a sensitized composition comprising from about 1 to about 20% by weight of an epoxy-silane; from about 80 to about 99%, by weight of a monomeric or prepolymeric epoxide material; and from about 0.5 to 10%, by weight of a radiation-sensitive aromatic diazonium salt of a complex halogenide which decomposes upon application of energy to release a Lewis acid all weights being based on the total weight of said epoxide material in said undercoat layer except the percent of said diazonium salt is based on the total weight of epoxide moiety containing compound in said undercoat layer and
2. as an overcoat layer, an organosiloxane in admixture with from about 10 to 50% by weight of an epoxy-silane as based on the total weight of the components in the overcoat layer, said epoxy-silane in said layers being selected from compounds having the general formula

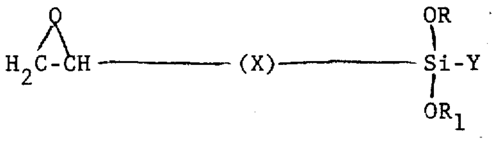

wherein each of X, R and $R_1$ is an alkylene, alkoxy, arylene, alkarylene, aralkylene, carbalkoxy or ether group and Y is an alkoxy or epoxy group; said organosiloxane being silicone elastomer formed by curing and/or polymerizing silicone gum;

said undercoat layer becoming firmly bonded to said overcoat layer through intra- and inter-layer reaction upon exposure of said coated substrate to an energy source.

13. A presensitized printing plate capable of being imaged comprising a substrate having applied thereto:

1. as an undercoat layer, a sensitized composition comprising from about 25 to 75% by weight of a monomeric or prepolymeric epoxide material; from about 25 to about 75%, by weight of said epoxide material, of an epoxy-silane; and from about 15 to 40%, by weight of said epoxide material, of a radiation-sensitive aromatic diazonium salt of a complex halogenide, said epoxy-silane being selected from compounds having the general formula

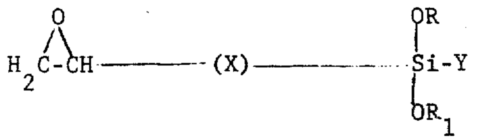

wherein each of X, R and $R_1$ is an alkylene, alkoxy, arylene, alkarylene, aralkylene, carbalkoxy or ether group and Y is an alkoxy or epoxy group; and said organosiloxane being silicone elastomer formed by curing and/or polymerizing silicone gum;

2. as an overcoat layer, an organosiloxane; said undercoat layer becoming firmly bonded to said overcoat layer through intra- and inter-layer reaction upon exposure of said coated substrate to an energy source.

14. A positive working, planographic printing plate, suitable for accepting ink only in oleophilic areas and printing therefrom while rejecting ink in oleophobic non-printing areas, in the absence of dampening, which comprises:

a base substrate having on at least one of its surfaces oleophilic printing areas and oleophobic non-printing areas;

said oleophobic non-printing areas consisting of an abhesive, polymerized solvent-insoluble reaction product of 1. an undercoat layer comprising an epoxy-silane, a monomeric or prepolymeric epoxide material and, as a catalyst precursor, a radiation-sensitive aromatic diazonium salt of a complex halogenide which decomposes upon application of energy to release a Lewis acid effective to initiate polymerization and interaction of said epoxide and epoxy-silane and
2. an overcoat layer comprising an organo-siloxane and from 0 to 50% of an epoxy-silane as based on the total weight of the components in the overcoat layer; with the proviso that (1) when said overcoat layer composition is devoid of epoxy-silane, said undercoat layer composition contains about 25 to about 75 percent epoxy-silane and about 15 to about 40 percent of said catalyst precursor, and (2) when said epoxy-silane is a component of said overcoat layer composition, said undercoat layer composition contains about 1 to about 20 percent epoxy-silane and about 0.5 to about 10 percent of said catalyst precursor, all percents being based on the total weight of said epoxide material in said undercoat layer except the percent of said catalyst precursor in proviso (2) is based on the total weight of epoxide moiety containing compounds in said undercoat layer and about 15 to 40 percent catalyst precursor, based on the weight of the epoxide material, when said overcoat layer as applied is devoid of epoxy-silane; said epoxy-silane in said layers being selected from compounds having the general formula

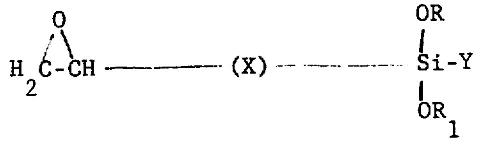

wherein each of X, R and $R_1$ is an alkylene, alakoxy, arylene, alkarylene, aralkylene, carbalkoxy or ether group and Y is an alkoxy or epoxy group; said organosiloxane being silicone elastomer formed by curing and/or polymerizing silicone gum;

said oleophilic printing areas being the areas of the base substrate free of said abhesive polymerized reaction product.

15. A planographic printing plate as claimed in claim 14 wherein said catalyst precursor is 2,5-diethoxy-4(p-tolylthio) benzene diazonium hexafluorophosphate.

16. A planographic printing plate as claimed in claim 14 wherein said substrate is metal, plastic or paper.

17. A planographic printing plate as claimed in claim 14 wherein said epoxide material is selected from the group consisting of epoxy-novolacs and glycidyl ethers of bisphenol A.

18. A planographic printing plate as claimed in claim 16 wherein said epoxy-silane is glycidoxypropyltrimethoxy silane.

19. A planographic printing plate as claimed in claim 14 wherein said overcoat layer comprises from about 10 to 50% by weight of said epoxy-silane.

20. A planographic printing plate as claimed in claim 19 wherein said epoxy-silane is glycidoxypropyltrimethoxysilane.

21. A planographic printing plate as claimed in claim 19 wherein said catalyst precursor is 2,5-diethoxy-4-(p-tolylthio) benzene diazonium hexaflourophosphate.

22. A planographic printing plate as claimed in claim 14 wherein said overcoat layer as applied is devoid of epoxy-silane.

23. A planographic printing plate as claimed in claim 22 wherein said epoxy-silane present in said undercoat is glycidoxypropyltrimethoxy silane.

24. A planographic printing plate as claimed in claim 23 wherein said catalyst precursor is 2,5-diethoxy-4-(p-tolyltio) benzene diazonium hexfluorophosphate.

25. A planographic printing plate as claimed in claim 14 in which the oleophilic printing areas consist of the bare base substrate.

26. A planographic printing plate as claimed in claim 14 in which the oleophilic printing areas consist of the cured undercoat layer.

27. A method for production of planographic printing plates which are suitable for accepting ink only in the oleophilic areas and printing therefrom while rejecting ink in the oleophobic non-printing areas, in the absence of dampening, which comprises:

1. applying to a substrate (a) as an undercoat layer a sensitized composition comprising an epoxy-silane, a monomeric or prepolymeric epoxide polymerizable to higher molecular wights through the action of a cationic catalyst and, as a catalyst precursor, a radiation-sensitive aromatic diazonium salt of a complex halogenide which decomposes upon application of energy to release a Lewis acid effective to initiate polymerization and interaction of said epoxide and epoxy-silane and (b) as an overcoat layer a composition comprising an organosiloxane and from 0 to 50 percent of an epoxy-silane as based on the total weight of the components in the overcoat layer;

with the proviso that (1) when said overcoat layer composition is devoid of epoxy-silane, said undercoat layer composition contains about 25 to about 75 percent epoxy-silane and about 15 to about 40 percent of said catalyst precursor, and (2) when said epoxy-silane is a component of said overcoat layer composition, said undercoat layer composition contains about 1 to about 20 percent epoxy-silane and about 0.5 to about 10 percent of said catalyst precursor, all percents being based on the total weight of said epoxide material in said undercoat layer except the percent of said catalyst precursor in proviso (2) is based on the total weight of epoxide moiety containing compounds in said undercoat layer said epoxy-silane in layers being selected from compounds having the general formula

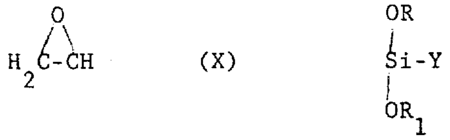

wherein each of X, R and $R_1$ is an alkylene, alkoxy, arylene, alkarylene, aralkylene, carbalkoxy or ether group and Y is an alkoxy or epoxy group; and said organosiloxane being silicone elastomer formed by curing and/or polymerizing silicone gum;

2. exposing at least a portion of said coated substrate to an energy source through an article having opaque and transparent areas to effect said polymerization and interaction and to render the exposed areas of said coated substrate insoluble and 3. removing said unexposed areas of said coated substrate.

28. A method as claimed in claim 27 wherein said energy source is electromagnetic radiation.

29. A method as claimed in claim 27 wherein said energy source is electron beam irradiation.

30. A method as claimed in claim 27 wherein said catalyst precursor is 2,5-diethoxy-4(p-tolylthio)-benzenediazonium hexafluorophosphate.

31. A method as claimed in claim 27 wherein said epoxide is selected from the group consisting of epxoy-novolacs and glycidyl ethers of bis-phenol A.

32. A method as claimed in claim 27 wherein said overcoat layer solution as applied is devoid of epxoy-silane.

33. A method as claimed in claim 27 wherein prior to the exposure to said energy source the coated substrate is permitted to react with atmospheric moisture.

34. A method as claimed in claim 27 wherein after exposure to said energy source but prior to removal of unexposed areas, the coated substrate is subjected to heat.

35. A method as claimed in claim 27 wherein said unexposed areas of the coated substrate are removed by a solvent or mixtures thereof.

36. A method as claimed in claim 27 wherein said overcoat layer solution contains from about 10 to about 50 percent by weight of said epoxy-silane.

37. A method as claimed in claim 36 wherein said epoxy-silane is glycidoxypropyltrimethoxysilane.

38. A method as claimed in claim 27 wherein said unexposed areas are removed employing a solvent which removes the organosiloxane but in which the epoxide material is insoluble.

39. A method as claimed in claim 38 wherein said solvent is cyclohexane.

40. A method as claimed in claim 38 wherein subsequent to removal of the organosiloxane, the coated substrate is exposed to an energy source to cure the epoxide material in the initially unexposed area.

* * * * *

UNITED STATES PATENT OFFICE

CERTIFICATE OF CORRECTION

PATENT NO. : 3,890,149

DATED : June 17, 1975

INVENTOR(S) : Schlesinger et al.

It is certified that error appears in the above-identified patent and that said Letters Patent are hereby corrected as shown below:

In the Specification:

At column 8, line 9, that portion of the compound reading, "2,5diethoxy" should be -- 2,5-diethoxy --.

At column 8, line 26, "section" should be -- selection --.

At column 9, line 58, "as" should be -- are --.

At column 11, line 27, the second occurrence of "percent by weight" should be deleted.

At column 11, line 40, "45 to 55 percent by weight" is repeated and should be deleted.

At column 11, line 65, "eposide" should be -- epoxide --.

At column 12, line 37, "filmls" should be -- films --.

At column 13, the illegible portion of formula (V) should read

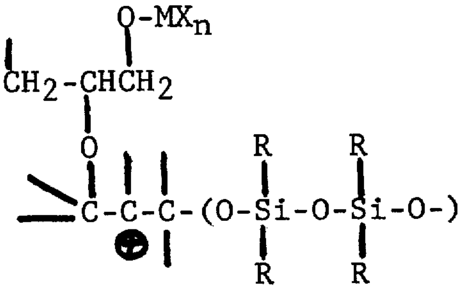

(V)

At column 14, line 57 "180.2" should read -- 180.2 g. --.

At column 16, line 16, "29 ml." should be -- 20 ml. --.

At column 16, line 57, "underocat" should be -- undercoat -- line 59, "atompheric" should be -- atmospheric --; and lines 67 and 68 "non-exposed area" should be -- the non-exposed areas --.

UNITED STATES PATENT OFFICE
CERTIFICATE OF CORRECTION

PATENT NO. : 3,890,149

DATED : June 17, 1975

INVENTOR(S) : Schlesinger et al.

It is certified that error appears in the above-identified patent and that said Letters Patent are hereby corrected as shown below:

In the Specification:

At column 17, line 26, "formulated" should be deleted and -- and -- substituted therefor; line 29, "formuaed" should be -- formulated --; line 34, "underocat" should be -- undercoat --; line 54 "layer" should be -- layers --; line 58, "overocat" should be -- overcoat --; line 63, "plaes" should be -- plates --.

At column 18, in Table II, under the heading Plate 4, "Note (4)" should be -- Note (3) --, line 41, "overocat" should be -- overcoat --.

In the Claims:

In claim 1, at line 34, compisition" should be -- composition --.

The phrase occurring at lines 61 to 63 should appear before line 46 after the formula and should read -- wherein each of X, R and $R_1$ is an alkylene, alkoxy, arylene, alkarylene, aralkylene, carbalkoxy or ether group and Y is an alkoxy or epoxy group --;

The phrase occurring at lines 63 to 66 "said undercoat layer becoming firmly bonded to said overcoat layer through intra- and inter-layer reaction upon exposure of said coated substrate to an energy source." should be deleted.

In claim 12, at column 21, line 41, a comma should be inserted after "acid"; at line 45, "compound" should be -- compounds --.

UNITED STATES PATENT OFFICE
CERTIFICATE OF CORRECTION

PATENT NO. : 3,890,149

DATED : June 17, 1975

INVENTOR(S) : Schlesinger et al.

It is certified that error appears in the above-identified patent and that said Letters Patent are hereby corrected as shown below:

In the Claims:

In claim 27, at column 23, lines 26 to 32, the formula should read:

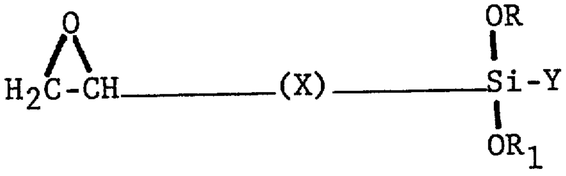

Signed and Sealed this

*sixth* Day of *January 1976*

[SEAL]

*Attest:*

RUTH C. MASON
*Attesting Officer*

C. MARSHALL DANN
*Commissioner of Patents and Trademarks*